(12) United States Patent
Zhong et al.

(10) Patent No.: US 11,222,816 B2
(45) Date of Patent: Jan. 11, 2022

(54) METHODS AND APPARATUS FOR SEMI-DYNAMIC BOTTOM UP REFLOW

(71) Applicant: APPLIED MATERIALS, INC., Santa Clara, CA (US)

(72) Inventors: Lanlan Zhong, Santa Clara, CA (US); Shirish A. Pethe, Cupertino, CA (US); Fuhong Zhang, San Jose, CA (US); Joung Joo Lee, San Jose, CA (US); Kishor Kalathiparambil, Santa Clara, CA (US); Xiangjin Xie, Fremont, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 25 days.

(21) Appl. No.: 16/902,655

(22) Filed: Jun. 16, 2020

(65) Prior Publication Data

US 2021/0391214 A1   Dec. 16, 2021

(51) Int. Cl.
| | |
|---|---|
| *H01L 21/768* | (2006.01) |
| *H01L 21/321* | (2006.01) |
| *H01L 23/532* | (2006.01) |

(52) U.S. Cl.
CPC .. *H01L 21/76882* (2013.01); *H01L 21/32115* (2013.01); *H01L 23/53228* (2013.01)

(58) Field of Classification Search
None
See application file for complete search history.

(56) References Cited

U.S. PATENT DOCUMENTS

| | | |
|---|---|---|
| 6,184,137 B1 | 2/2001 | Ding et al. |
| 6,399,486 B1 | 6/2002 | Chen et al. |
| 6,599,828 B1 | 7/2003 | Gardner |
| 7,078,651 B2 | 7/2006 | Jennings |
| 8,841,211 B2 | 9/2014 | Lee et al. |
| 9,863,038 B2 | 1/2018 | Ewert et al. |

(Continued)

OTHER PUBLICATIONS

Soo Ouk Jang • Hyun Jong You • Young-Woo Kim • Yong Ho Jung in Uk Hwang • Jae Yang Park • Heon Lee, Deposition of a Continuous and Conformal Copper Seed Layer by a Large-Area Electron Cyclotron Resonance Plasma Source with Embedded Lisitano Antenna, Accepted: Nov. 1, 2013 / Published online: Nov. 12, 2013 _ Springer Science Business Media New York 2013, Plasma Chem Plasma Process (2014) 34:229-237.

(Continued)

*Primary Examiner* — Erik Kielin
(74) *Attorney, Agent, or Firm* — Moser Taboada

(57) ABSTRACT

A method of filling structures on a substrate uses a semi-dynamic reflow process. The method may include depositing a metallic material on the substrate at a first temperature, heating the substrate to a second temperature higher than the first temperature wherein heating of the substrate causes a static reflow of the deposited metallic material on the substrate, stopping heating of the substrate, and depositing additional metallic material on the substrate causing a dynamic reflow of the deposited additional metallic material on the substrate. RF bias power may be applied during the dynamic reflow to facilitate in maintaining the temperature of the substrate.

19 Claims, 4 Drawing Sheets

(56) References Cited

U.S. PATENT DOCUMENTS

| | | | |
|---|---|---|---|
| 2012/0231633 A1* | 9/2012 | Ewert | H01L 21/2855 |
| | | | 438/763 |
| 2016/0141241 A1* | 5/2016 | Nakajima | H01L 23/53238 |
| | | | 257/751 |
| 2018/0047624 A1* | 2/2018 | Nagai | C23C 14/025 |
| 2019/0164827 A1* | 5/2019 | Yang | H01L 21/324 |

OTHER PUBLICATIONS

Kheng Chok Tee, Cluster Devices/Interconnects for Nanotechnology, A thesis submitted in partial fulfilment of the requirements for the Degree of Doctor of Philosophy in Electrical Engineering in the University of Canterbury Department of Electrical and Computer Engineering 2008, 262 pages.

* cited by examiner

METHODS AND APPARATUS FOR SEMI-DYNAMIC BOTTOM UP REFLOW

FIELD

Embodiments of the present principles generally relate to semiconductor processing of semiconductor substrates.

BACKGROUND

A semiconductor device such as an IC (integrated circuit) generally has electronic circuit elements such as transistors, diodes, and resistors fabricated integrally on a single body of semiconductor material such as a wafer or substrate. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. The interconnects may be constructed throughout multiple layers and connected within/between layers by trenches/vias. As the push for smaller and smaller form factors continues, the interconnects must also be scaled down to enable the smaller form factors of semiconductor devices. Trenches/vias with 5 nm node structures and beyond pose challenges during formation due to the small sizes. Static reflow processes are often used as a method to fill in the trenches/vias. The inventors have found, however, that the static reflow processes require multiple cycles that dramatically decrease the throughput of the wafers.

Accordingly, the inventors have provided improved methods and apparatus for increasing the throughput of wafers that require gap filling processes.

SUMMARY

Methods and apparatus for improving gap fill processes for the formation of interconnects on wafers are provided herein.

In some embodiments, a method of filling structures on a substrate may comprise depositing a metallic material on the substrate at a first temperature, heating the substrate to a second temperature higher than the first temperature, heating of the substrate causing a static reflow of the metallic material on the substrate, stopping heating of the substrate, and depositing additional metallic material on the substrate causing a dynamic reflow of the additional metallic material on the substrate.

In some embodiments, the method may further include applying RF bias power during the dynamic reflow to heat the substrate, wherein the first temperature is approximately 0 to approximately 70 degrees Celsius, wherein the metallic material is a copper-based material, wherein the second temperature is approximately 80 degrees Celsius to approximately 400 degrees Celsius, wherein the second temperature is approximately 270 degrees Celsius, positioning the substrate at a first position prior to depositing the metallic material on the substrate, positioning the substrate at a second position, above the first position, prior to heating the substrate and moving the substrate from the second position to the first position when heating of the substrate is stopped, wherein heating of substrate is from a heating source located below the substrate, heating the substrate to a third temperature greater than the first temperature and less than the second temperature and heating the substrate to the second temperature from the third temperature after a first period of time, and/or wherein the first period of time is approximately 30 seconds.

In some embodiments, a method of filling structures on a substrate may comprise depositing a metallic material on the substrate at a first temperature, heating the substrate to a second temperature higher than the first temperature causing a first static reflow with a first reflow rate, heating the substrate to a third temperature higher than the second temperature causing a second static reflow with a second reflow rate, wherein the second reflow rate is higher than the first reflow rate, stopping heating of the substrate, applying RF bias power to the substrate, and depositing additional metallic material on the substrate causing a dynamic reflow of the additional metallic material on the substrate.

In some embodiments, the method may further include wherein the first temperature is approximately 0 to approximately 70 degrees Celsius, wherein the first temperature is approximately room temperature, wherein the metallic material is a copper-based material, wherein the second temperature is approximately 80 degrees Celsius to approximately 225 degrees Celsius, wherein the third temperature is approximately 250 degrees Celsius to approximately 400 degrees Celsius, and/or wherein the third temperature is approximately 270 degrees Celsius.

In some embodiments, a non-transitory, computer readable medium having instructions stored thereon that, when executed, cause a method for filling structures on a substrate to be performed, the method may comprise depositing a metallic material on the substrate at a first temperature, heating the substrate to a second temperature higher than the first temperature, heating of the substrate causing a static reflow of the metallic material on the substrate, stopping heating of the substrate, and depositing additional metallic material on the substrate causing a dynamic reflow of the additional metallic material on the substrate.

In some embodiment, the non-transitory, computer readable medium may further include positioning the substrate at a first position prior to depositing the metallic material on the substrate, positioning the substrate at a second position, above the first position, prior to heating the substrate, and moving the substrate from the second position to the first position when the heat is removed from the substrate, and/or applying RF bias power during the dynamic reflow to heat the substrate.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
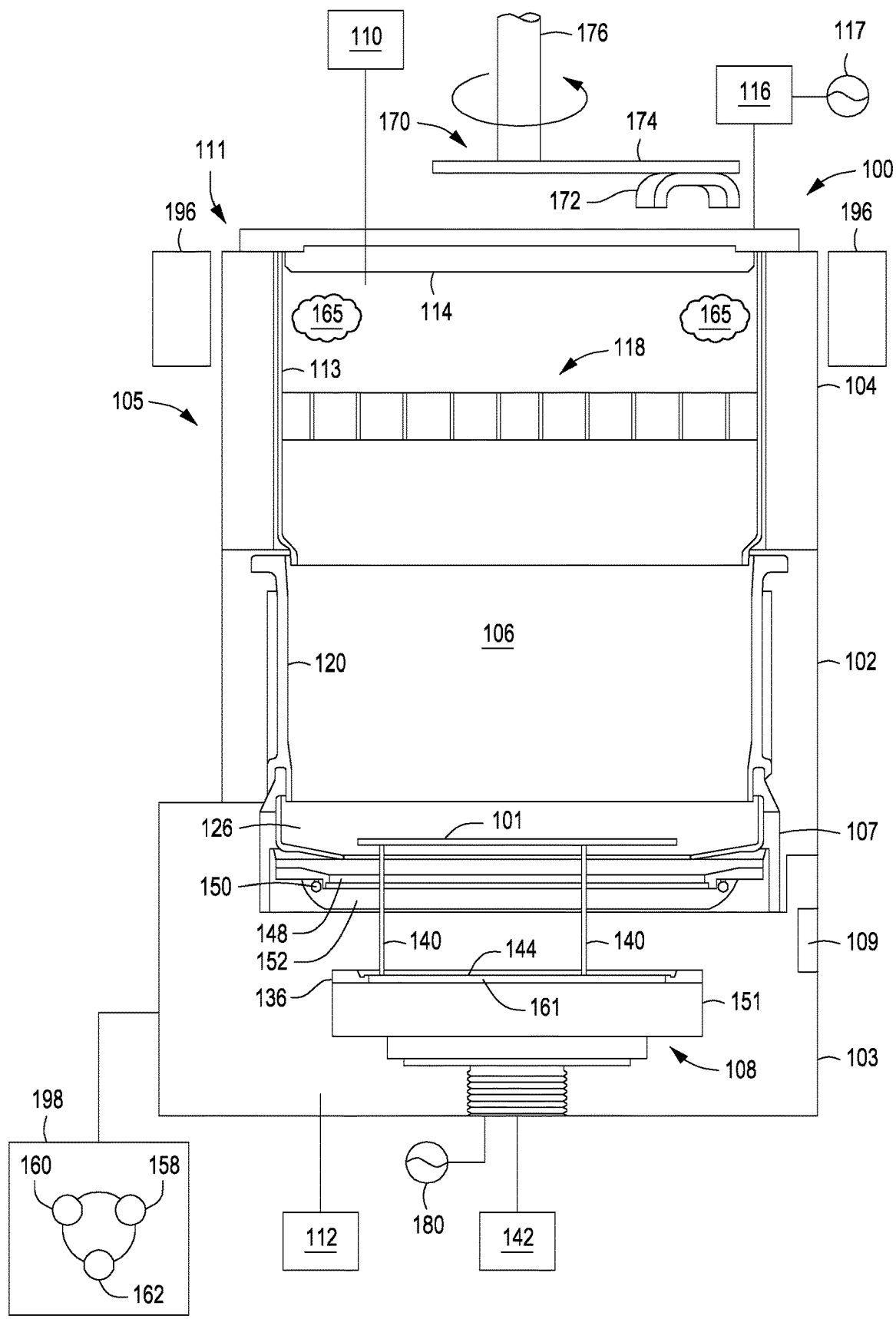
FIG. 1 depicts a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide gap fill processes that utilize a semi-dynamic reflow. The fill material is deposited on structures on a substrate which is then raised, in one or more stages, to a static reflow temperature. The fill material is allowed to reflow into the structures for a given period of time and then a heat source is removed. A subsequent deposition is performed on the substrate causing a dynamic reflow process to occur. Advantageously, the semi-dynamic reflow process enables metal dynamic reflow following static reflow in a single lamp chamber to allow bottom-up fill of 5 nm node structures and beyond. For example, a semi-dynamic copper reflow process in a single chamber can provide up to 2 to 3 times or more throughput improvement in comparison to multicycle static reflow processes. The semi-dynamic reflow process can also be utilized for back-end-of-line (BEOL) and middle-end-of-line (MEOL) processing.

With ever shrinking feature sizes, the small sizes present a challenge when attempting to achieve good gap fill and electrical yield performance using the conventional gap fill approaches such as plasma vapor deposition (PVD) for copper seed which is then followed by copper electrochemical plating (ECP). In some instances for 5 nm nodes and beyond, copper reflow may be chosen as a primary approach for a gap fill solution. The methods and apparatus of the present principles can enable void-free gap fill performance for 5 nm node and beyond for copper fill materials while still providing a 2-3 times or more throughput improvement in comparison to multicycle static reflows with copper materials. Although copper may be used in examples for the sake of brevity, the processes may be applied to other materials such as aluminum or cobalt and the like.

Metal reflow may be achieved by a multicycle static reflow using a room temperature metal deposition phase followed by a thermal heating process phase, and then a cool down phase. The multicycle static flow process is very time consuming, reducing wafer throughput. Metal reflow may also be achieved by a dynamic reflow where a metal deposition and reflow process occur simultaneously while a wafer is heated. The dynamic reflow cannot achieve void free gap fill due to line end agglomeration and voids at a via bottom. The methods and apparatus of the present principles use a semi-dynamic reflow that employs both reflow approaches in a single process—static reflow to fill the via and dynamic reflow to fill the trench. The semi-dynamic reflow not only increases throughput, but also provides the flexibility of temperature variation. The temperature variation is achieved by controlling the time and power of a heating lamp of a process chamber which enables a balanced control of metal film agglomeration and bottom-up fill.

In some embodiments, a semi-dynamic bottom up reflow process may include first depositing a layer of metallic material on a substrate with at least one structure to be filled. Static reflow of the metallic material is achieved by using lamps to heat up the substrate which allows the metallic material to reflow down to the bottom of the structures. A subsequent dynamic reflow is accomplished by keeping substrate cooling to a minimum before and during the dynamic reflow process. Minimizing cooling is achieved by removing backside gases, before and during the dynamic deposition while gently chucking the wafer to prevent substrate sliding. During the dynamic reflow process, thermal and kinetic energy are kept sufficient for metallic material mobility. The thermal energy is maintained, in part, by keeping the substrate temperature high enough with no backside gas present. The kinetic energy is achieved by using a mid-level substrate bias which aids in accelerating the metallic material ions to bombard the substrate and to heat up the substrate by converting the kinetic energy to thermal energy.

Embodiments of the present disclosure are illustratively described herein with respect to a physical vapor deposition (PVD) chamber. However, the methods and apparatus of the present principles may be used in other process chambers as well. FIG. 1 illustrates a PVD chamber (process chamber 100), e.g., a sputter process chamber, suitable for sputter depositing materials on a substrate having a given diameter. In some embodiments, the PVD chamber further includes a collimator 118 disposed therein. The process chamber 100 generally includes an upper sidewall 102, a lower sidewall 103, a ground adapter 104, and a lid assembly 111 defining a body 105 that encloses an interior volume 106. The interior volume 106 includes a central portion having approximately the given diameter of the substrate to be processed and a peripheral portion surrounding the central portion. In addition, the interior volume 106 includes an annular region above the substrate and proximate a target, wherein an inner diameter of the annular region is substantially equal to or greater than a diameter of the substrate such that a predominant portion of the plasma is disposed in a position both above and radially outward of the substrate.

An adapter plate 107 may be disposed between the upper sidewall 102 and the lower sidewall 103. A substrate support 108 is disposed in the interior volume 106 of the process chamber 100. The substrate support 108 may include, for example, an electrostatic chuck (ESC) 151 with a puck 161. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106. In some embodiments, the process chamber 100 is configured to deposit, for example, copper, aluminum, or cobalt on a substrate, such as the substrate 101. Non-limiting examples of suitable applications include metallic gap fill material deposition in vias, trenches, or structures, or the like.

A gas source 110 is coupled to the process chamber 100 to supply process gases into the interior volume 106. In some embodiments, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and water ($H_2O$) vapor among others. A pumping device 112 is coupled to the process chamber 100 in communication with the interior volume 106 to control the pressure of the interior volume 106. In some embodiments, the pumping device 112 may also be used to remove backside gases from the substrate 101 in order to minimize cooling down of the substrate 101. In some embodiments, during deposition the pressure level of the process chamber 100 may be maintained at approximately 1 Torr or less. In some embodiments, the pressure level of the process chamber 100 may be maintained at approximately 500 mTorr or less during deposition. In some embodiments, the pressure level of the process chamber 100 may be maintained at approximately 0.01 mTorr to approximately 300 mTorr during deposition.

The ground adapter 104 may support a target, such as target 114. The target 114 is fabricated from a material to be deposited on the substrate. In some embodiments, the target 114 may be fabricated from cobalt (Co), copper (Cu), or aluminum (Al), alloys thereof, combinations thereof, or the like. The target 114 may be coupled to a source assembly comprising a power supply 117 for the target 114. In some embodiments, the power supply 117 may be an RF power supply, which may be coupled to the target 114 via a match network 116. In some embodiments, the power supply 117 may alternatively be a DC power supply, in which case the match network 116 is omitted. In some embodiments, the power supply 117 may include both DC and RF power sources.

A magnetron 170 is positioned above the target 114. The magnetron 170 may include a plurality of magnets 172 supported by a base plate 174 connected to a shaft 176, which may be axially aligned with the central axis of the process chamber 100 and the substrate 101. The magnets 172 produce a magnetic field within the process chamber 100 near the front face of the target 114 to generate plasma so a significant flux of ions strike the target 114, causing sputter emission of target material. The magnets 172 may be rotated about the shaft 176 to increase uniformity of the magnetic field across the surface of the target 114. Examples of the magnetron include an electromagnetic linear magnetron, a serpentine magnetron, a spiral magnetron, a double-digitated magnetron, a rectangularized spiral magnetron, a dual motion magnetron, among others. The magnets 172 are rotated about the central axis of the process chamber 100 within an annular region extending between about the outer diameter of the substrate to about the outer diameter of the interior volume 106. In general, magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed).

The process chamber 100 further includes an upper shield 113 and a lower shield 120. A collimator 118 is positioned in the interior volume 106 between the target 114 and the substrate support 108. In some embodiments, the collimator 118 may be electrically biased to control ion flux to the substrate and neutral angular distribution at the substrate, as well as to increase the deposition rate due to the added DC bias. Electrically biasing the collimator results in reduced ion loss to the collimator, advantageously providing greater ion/neutral ratios at the substrate. A collimator power source (not shown) is coupled to the collimator 118 to facilitate biasing of the collimator 118. In some embodiments, the collimator 118 may be electrically isolated from grounded chamber components such as the ground adapter 104. For example, as depicted in FIG. 1, the collimator 118 is coupled to the upper shield 113.

In some embodiments, a set of magnets 196 may be disposed adjacent to the ground adapter 104 to assist with generating the magnetic field to guide dislodged ions from the target 114. The magnetic field formed by the set of magnets 196 may alternatively or in combination prevent ions from hitting the sidewalls of the chamber (or sidewalls of the upper shield 113) and direct the ions vertically through the collimator 118. For example, the set of magnets 196 are configured to form a magnetic field having substantially vertical magnetic field lines in the peripheral portion. The substantially vertical magnetic field lines advantageously guide ions through the interior volume. The set of magnets 196 may include any combination of electromagnets and/or permanent magnets necessary to guide the metallic ions along a desired trajectory from the target, through the collimator, and toward the center of the substrate support 108. The set of magnets 196 may be stationary or moveable to adjust the position of a set of magnets in a direction parallel to a central axis of the chamber.

An RF power source 180 may be coupled to the process chamber 100 through the substrate support 108 to provide a bias power between the target 114 and the substrate support 108. In some embodiments, the RF power source 180 may have a frequency between approximately 400 Hz and approximately 200 MHz, such as approximately 13.56 MHz. In some embodiments, the RF power source 180 may provide greater than zero watts to approximately 1000 watts of bias power. In operation, the magnets 172 are rotated to form a plasma 165 in the annular portion of the interior volume 106 to sputter the target 114. The plasma 165 may be formed above the collimator 118, when the collimator 118 is present to sputter the target 114 above the collimator 118. The radius of rotation of the magnets 172 is greater than the radius of the substrate 101 to ensure that little to no sputtered material exists above the substrate 101.

The collimator 118 is positively biased so that the metallic sputtered material is forced through the collimator 118. Moreover, most, if not all, of the neutral sputtered material traveling toward the central region of the collimator will likely collide with and stick to the collimator walls. Because the directionality of the metallic neutrals cannot be changed, most, if not all, of the metallic neutrals are advantageously not deposited on the substrate 101. To ensure that the trajectory of the sputtered metallic ions has enough space to be changed, the collimator 118 is disposed at a predetermined height above the substrate support 108. In some embodiments, the height is between approximately 400 mm to approximately 800 mm, for example, approximately 600 mm. The height is also chosen to facilitate control of ions using the magnetic field beneath the collimator 118 to further improve deposition characteristics on the substrate 101. To enable modulation of the magnetic field above the collimator 118, the collimator 118 may be disposed at a predetermined height beneath the target 114. The height may be between approximately 25 mm to approximately 75 mm, for example, approximately 50 mm. The overall target to substrate spacing (or target to support surface spacing), is approximately 600 mm to approximately 800 mm.

In some embodiments, the lower shield 120 may be provided in proximity to the collimator 118 and interior of the ground adapter 104 or the upper sidewall 102. The collimator 118 includes a plurality of apertures to direct gas and/or material flux within the interior volume 106. The collimator 118 may be coupled to the collimator power source via the process tool adapter 138. A shield ring 128 may be disposed in the process chamber 100 adjacent to the lower shield 120 and intermediate of the lower shield 120 and the adapter plate 107. The substrate 101 (shown supported on lift pins 140 in a raised heating or reflow position)

is centered relative to the longitudinal axis of the substrate support 108 by coordinated positioning calibration between the substrate support 108 and a robot blade (not shown). Thus, the substrate 101 may be centered within the process chamber 100 and the shield ring 126 may be centered radially about the substrate 101 during processing.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 may be controlled by a drive 142 coupled to the substrate support 108. The substrate support 108 may be lowered as the lift pins 140 are raised to reach a heating or reflow position. Similarly, the substrate 101 may be lowered onto a substrate receiving surface 144 of the substrate support 108 by lowering the lift pins 140 and raising the substrate support 108 to a process or deposition position. With the substrate 101 positioned on the substrate receiving surface 144 of the substrate support 108, sputter deposition may be performed on the substrate 101. The deposition ring 136 may be electrically insulated from the substrate 101 during processing. Therefore, the substrate receiving surface 144 may include a height that is greater than a height of portions of the deposition ring 136 adjacent the substrate 101 such that the substrate 101 is prevented from contacting the deposition ring 136.

After sputter deposition, the substrate 101 may be elevated utilizing the lift pins 140 to a position that is spaced away from the substrate support 108. The elevated location may be above one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave portion 152 of the adapter plate 107. The lamps 150 provide optical and/or radiant energy in the visible or near visible wavelengths, such as in the infrared (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. After controlling the substrate 101 to a predetermined temperature, the substrate 101 is lowered to a position on the substrate receiving surface 144 of the substrate support 108. The substrate 101 may be removed from the process chamber 100 through the substrate transfer port 109 for further processing. The substrate 101 may be maintained at a predetermined temperature range, such as, but not limited to, less than 600 degrees Celsius.

A controller 198 controls the operation of the process chamber 100 using a direct control of the process chambers or alternatively, by controlling the computers (or controllers) associated with the process chambers and the process chamber 100. In operation, the controller 198 enables data collection and feedback from the respective chambers and systems to optimize performance of the process chamber 100. The controller 198 generally includes a Central Processing Unit (CPU) 160, a memory 158, and a support circuit 162. The CPU 160 may be any form of a general-purpose computer processor that can be used in an industrial setting. The support circuit 162 is conventionally coupled to the CPU 160 and may comprise a cache, clock circuits, input/output subsystems, power supplies, and the like. Software routines, such as a method as described above may be stored in the memory 158 and, when executed by the CPU 160, transform the CPU 160 into a specific purpose computer (controller 198). The software routines may also be stored and/or executed by a second controller (not shown) that is located remotely from the process chamber 100.

The memory 158 is in the form of computer-readable storage media that contains instructions, when executed by the CPU 160, to facilitate the operation of the semiconductor processes and equipment. The instructions in the memory 158 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive, or any type of solid-state random access semiconductor memory) on which alterable information is stored. Such computer-readable storage media, when carrying computer-readable instructions that direct the functions of the methods described herein, are aspects of the present principles.

During processing, material is sputtered from the target 114 and deposited on the surface of the substrate 101. The target 114 and the substrate support 108 are biased relative to each other by the power supply 117 or the RF power source 180 to maintain a plasma formed from the process gases supplied by the gas source 110. In some embodiments, the DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions. The substrate 101 is then raised to a heating or reflow position and heated by the lamps 150 during static reflow portions of the process. The lamps 150 are then turned off, backside gases are pumped out using pumping device 112, and the substrate 101 is lowered to a processing or deposition position. The substrate 101 is then heated using RF bias power supplied by the RF power source 180 during the dynamic reflow portion of the process.

Figure 2:
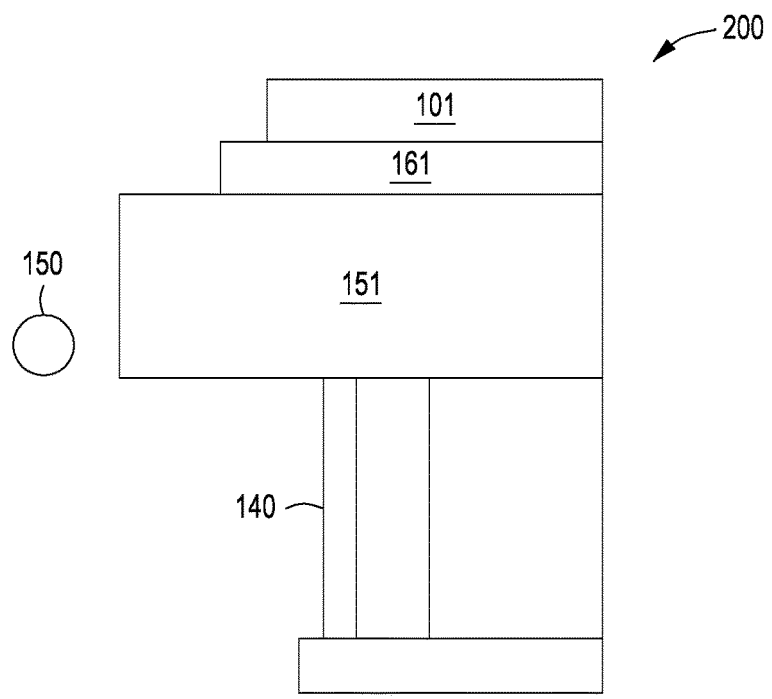
FIG. 2 depicts a cross-sectional view of a portion of the process chamber in a processing or deposition position in accordance with some embodiments of the present principles.
Figure 3:
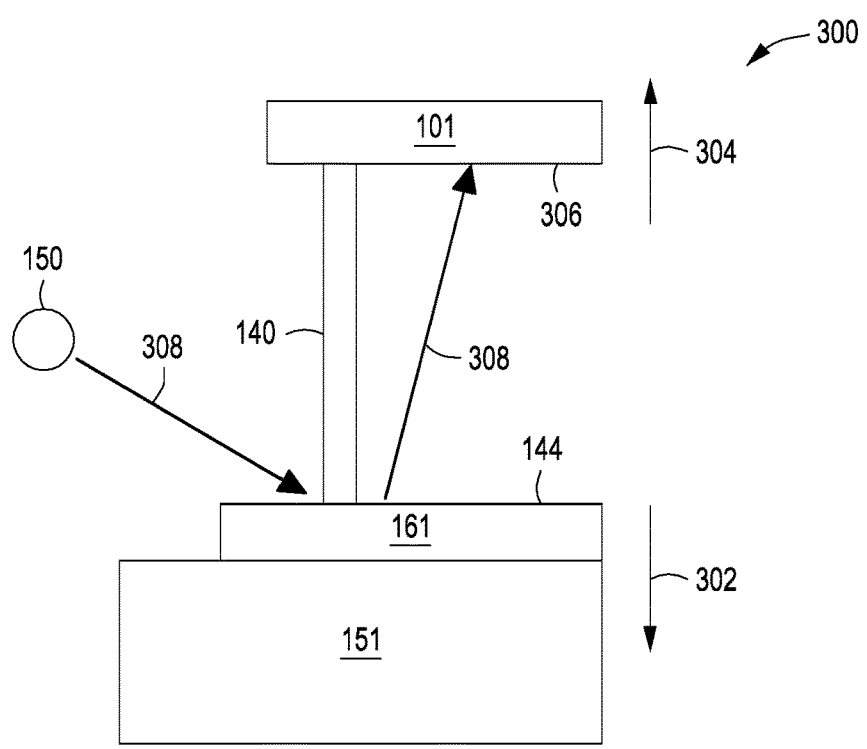
FIG. 3 depicts a cross-sectional view of a portion of the process chamber in a heating or reflow position in accordance with some embodiments of the present principles.

FIG. 2 is a cross-sectional view 200 of a portion of the substrate support 108 of the process chamber 100 including ESC 151 and the lamp 150 in a processing or deposition position (the substrate 101 is in a lowered position, not shown in FIG. 1). The lamp 150 radiates infrared or ultraviolet heat when the lamp 150 is operational. The substrate 101 is supported by the puck 161 which interfaces with the ESC 151. The lift pins 140 enable lifting of the substrate 101 off of the substrate receiving surface 144 of the puck 161 when the substrate 101 is in a heating or reflow position. In FIG. 3, a cross-sectional view 300 depicts the substrate 101 and the substrate support 108 in the heating or reflow position (the substrate 101 is in a raised position, as shown in FIG. 1). In the reflow position, the substrate support 108 is lowered 302 as the lift pin 140 raises 304 the substrate 101, leaving a lower surface 306 of the substrate 101 exposed to heat radiation 308 from the lamp 150.

Figure 4:
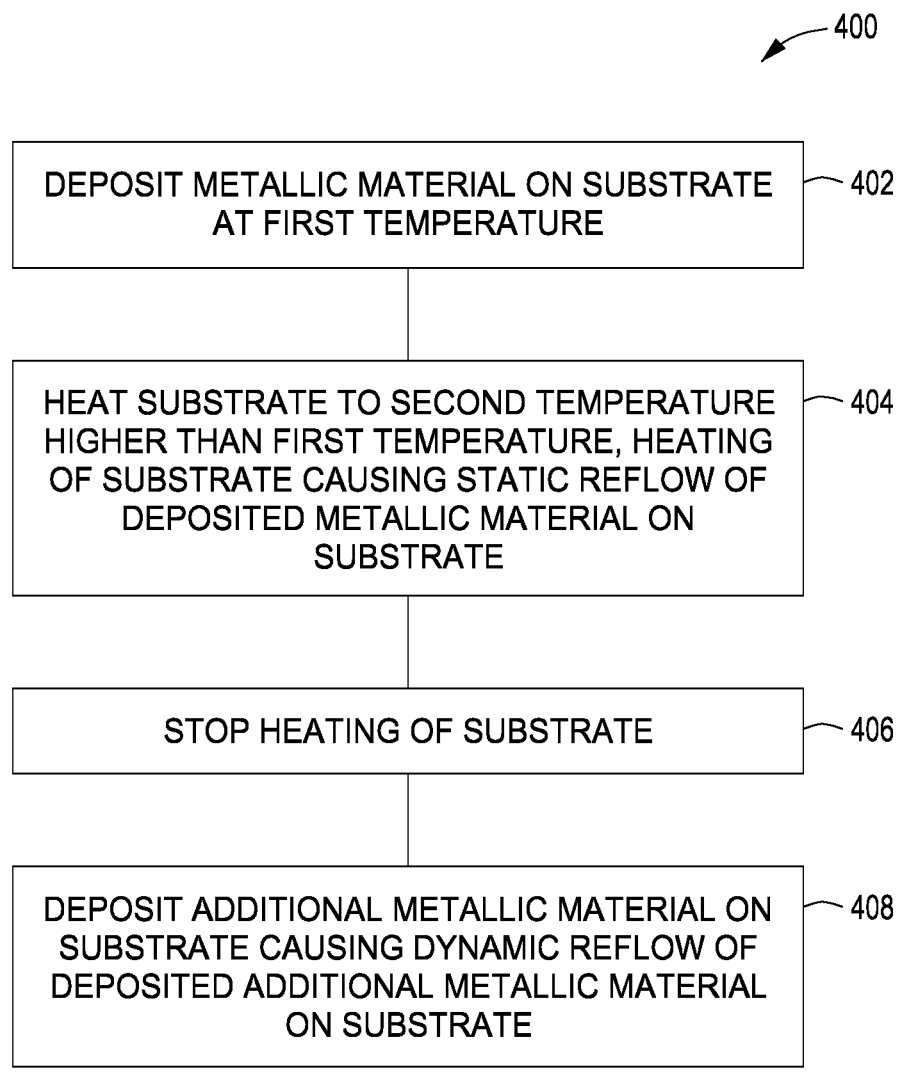
FIG. 4 a method of filling gaps on a substrate in accordance with some embodiments of the present principles.
Figure 5:
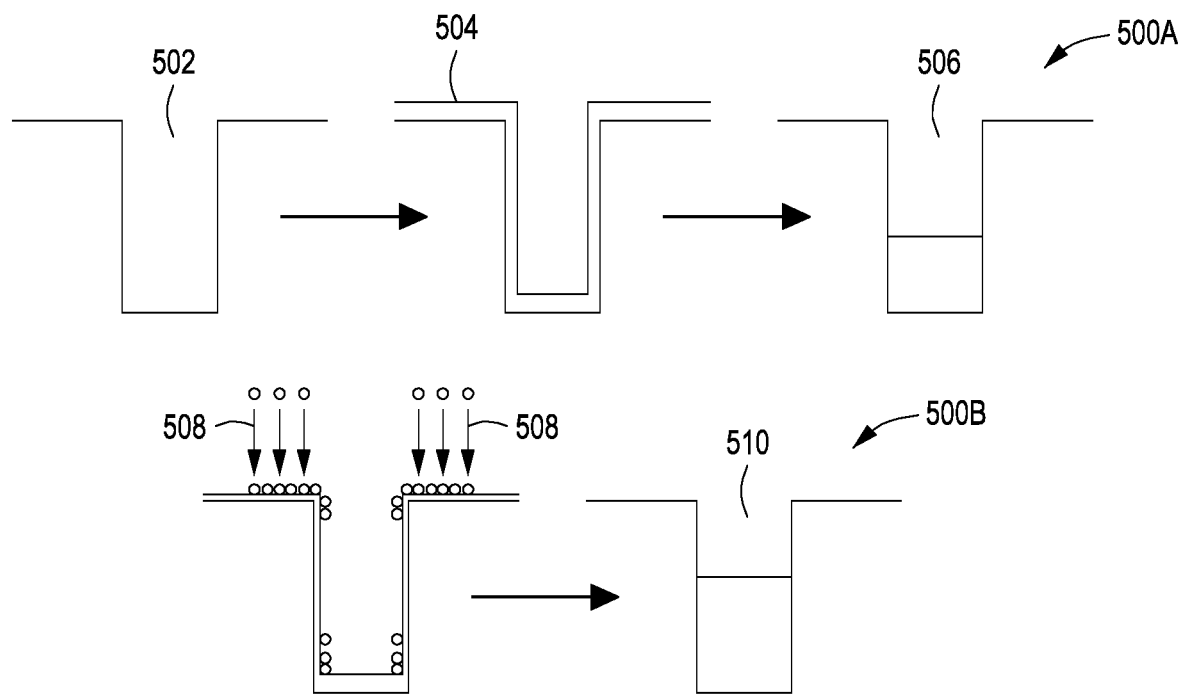
FIG. 5 depicts a cross-sectional view of a structure being gap filled in accordance with some embodiments of the present principles.
Figure 6:
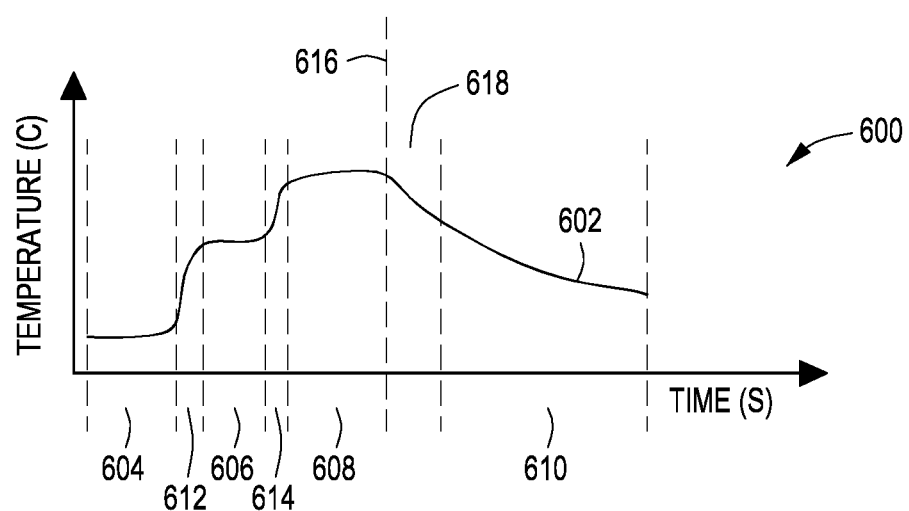
FIG. 6 depicts a graph of a heating cycle in accordance with some embodiments of the present principles.

FIG. 4 is a method 400 of filling structures on a substrate according to some embodiments. In block 402, a metallic material is deposited on a substrate at a first temperature. In some embodiments, the metallic material may be a copper-based material, an aluminum-based material, or a cobalt-based material and the like. For the sake of brevity, a copper-based material may be used in some examples that follow but is not meant to be limiting in any manner. In some embodiments, the deposition of the metallic material may occur at a first temperature of approximately room temperature. In some embodiments, the first temperature may be from approximately zero degrees Celsius to approximately 70 degrees Celsius. In some embodiments, the first temperature is approximately 40 degrees Celsius. In FIG. 5, a cross-sectional view 500A illustrates the structure 502 on the substrate with a metallic material 504 being deposited on the substrate at the first temperature. In some embodiments, the metallic material 504 is deposited when the substrate is in a process or deposition position (lowered position) as illustrated in FIG. 2. In a view 600 of a graph of FIG. 6 depicts a process temperature profile of some embodiments of the method 400 by graph line 602. The "cold" or room temperature deposition of some embodiments of the method 400 is denoted by a deposition period 604. In some embodiments, the deposition period 604 may be from approximately 15 seconds to approximately 60 seconds depending on an amount of metallic material to be deposited.

In block 404 of FIG. 4, the substrate is heated to a second temperature higher than the first temperature to cause a static reflow of the metallic material. The substrate may be moved into a heating or reflow position (raised position as depicted in FIG. 1) different from the process or deposition position prior to the heating of the metallic material. A second temperature heating period 608 of FIG. 6 may have a range of approximately 10 seconds to approximately 120 seconds. In some embodiments, the second temperature heating period 608 is from approximately 20 seconds to approximately 30 seconds for copper-based material. In some embodiments for a copper-based material, the second temperature may range from approximately 80 degrees Celsius to approximately 400 degrees Celsius. When a substrate contains low k materials, heating the substrate above 400 degrees Celsius may damage the low k materials. In some embodiments for a copper-based material, the second temperature may be approximately 270 degrees Celsius. In some embodiments for an aluminum-based material, the second temperature may range from approximately 80 degrees Celsius to approximately 400 degrees Celsius. In some embodiments for a cobalt-based material, the second temperature may range from approximately 80 degrees Celsius to approximately 550 degrees Celsius.

The heating of the substrate causes a static reflow of the deposited metallic material on the substrate. The inventors have found that the second temperature should be sufficient enough to maintain the mobility of the metallic material and may change based upon the type of metallic material being reflowed. The cross-sectional view 500A of FIG. 5 depicts the static reflow filling 506 the structure 502 with the previously deposited metallic material 504. The heating of the substrate and the maintaining of the substrate temperature may be accomplished by the lamp 150 of the process chamber 100 of FIG. 1. The lamp power ON time and the lamp power level may be used to adjust the temperature of the substrate. The lamp 150 may provide direct heat radiation (infrared and/or ultraviolet radiation) and also indirect heat radiation which reflects off of the substrate receiving surface 144 of the puck 161 of the ESC 151.

In some embodiments, the heating of the substrate to the second temperature may be accomplished in more than one stage. The graph line 602 depicts a third temperature heating period 606 at a third temperature less than the second temperature and higher than the first temperature. In some embodiments, the third temperature may be approximately 80 degrees Celsius to approximately 225 degrees Celsius. In some embodiments, the third temperature may be approximately 150 degrees Celsius to approximately 200 degrees Celsius. In some embodiments, the third temperature may be approximately 170 degrees Celsius. Using multiple stages of heating allows for the metallic material to slowly flow into the structure to allow a continuous and even flow with no breaks. The third temperature should be sufficient enough to maintain the mobility of the metallic material. The third temperature may be adjusted based upon the type of metallic material being reflowed. In some embodiments, two or more temperature stages may occur between the first temperature and the second temperature. In some embodiments, the third temperature heating period 606 may range from approximately 10 seconds to approximately 120 seconds or more. In some embodiments, the third temperature heating period 606 be approximately 30 seconds. Intermediate heat-up periods 612, 614 have a time duration that is dependent on heating rates between the first temperature, the second temperature, and the third temperature. Using multiple stages of heating allows the metallic material to flow slowly and evenly without causing breaks while higher temperatures allow for a smooth transition into a faster reflow.

In block 406, the heating of the substrate is stopped. In FIG. 6, a point of heat removal for some embodiments is indicated by a heat removal point 616. In some embodiments, the heating of the substrate is stopped by removing the power to the lamp 150 (see FIG. 3). In some embodiments, the backside gases may be removed when heating is stopped to facilitate in minimizing cooling of the substrate prior to and during dynamic reflow. The backside gases may be removed by the pumping device 112 of the process chamber 100 of FIG. 1. In block 408, an additional metallic material is deposited on the substrate. The deposition on the hot substrate causes a dynamic reflow of the additional metallic material on the substrate. In some embodiments, the substrate is moved from the heating or reflow position when the heating is stopped and moved to the process or deposition position prior to the start of the depositing of the additional metallic material onto the substrate. In FIG. 6, a re-positioning period 618 is denoted in view 600. The substrate may experience some cooling during the re-positioning period. Keeping the re-positioning period 618 at a minimum will help maintain the substrate temperature and will ensure that a dynamic reflow period 610 is maximized. The view 500B of FIG. 5 depicts a deposition 508 occurring on the structure 502 while the substrate is hot. Dynamic reflow occurs and the additional metallic material flows into the structure 502 filling 510 the structure 502. The inventors have found that substrate cooling should be kept at a minimum during the dynamic reflow processes. Minimizing cooling is achieved by removing the backside gases before and during the dynamic deposition.

The inventors have also found that during the dynamic reflow process, thermal and kinetic energy should be kept sufficient for metallic material mobility. The thermal energy is maintained, in part, by keeping the substrate temperature high enough with no backside gas present. In some embodiments for copper-based materials, the dynamic reflow (simultaneous deposition and reflow) continues as long as the substrate temperature is between approximately 80 degrees Celsius and approximately 400 degrees Celsius. In some embodiments for copper-based materials, the dynamic reflow continues as long as the substrate temperature is between approximately 150 degrees Celsius and approximately 400 degrees Celsius. In some embodiments for cobalt-based materials, the dynamic reflow continues as long as the substrate temperature is between approximately 80 degrees Celsius and approximately 550 degrees Celsius.

The kinetic energy is achieved by using a mid-level substrate bias which aids in accelerating the metallic material ions to bombard the substrate and to heat up the substrate by converting the kinetic energy to thermal energy. In some embodiments for copper-based metallic material, the mid-level RF bias power is approximately 200 watts with an etching to deposition (ED) ratio of approximately 0.40 to approximately 0.60. In some embodiments, the mid-level RF bias power is approximately 5 watts to approximately 1000 watts. In some embodiments, the mid-level RF bias power is approximately 5 watts to approximately 700 watts. In some embodiments, the RF bias frequency is approximately 2 MHz to approximately 200 MHz. In some embodiments, the RF bias frequency is approximately 13.56 MHz. In some embodiments, the RF power source 180 of the process chamber 100 of FIG. 1 may provide the RF bias power to the substrate 101 to enhance the kinetic energy during deposition for the dynamic reflow process. The inventors have found that if the RF bias power is too high, damage will be caused at the edges (corners) of the openings of the structures. The inventors have also found that if the RF bias power is too low, the reflow profile will be poor. In effect, the RF bias power provides plasma heating of the substrate to facilitate in maintaining the temperature of the wafer during dynamic reflow.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of filling structures on a substrate, comprising:
    depositing a first metallic material on the substrate at a first temperature;
    heating the substrate to a second temperature higher than the first temperature;
    heating the substrate to a third temperature higher than the first second temperature after a first period of time, heating of the substrate to the third temperature causing a static reflow of the first metallic material on the substrate;
    stopping heating of the substrate; and
    depositing a second metallic material on the substrate causing a dynamic reflow of the second metallic material on the substrate.

2. The method of claim 1, further comprising:
    applying RF bias power during the dynamic reflow to heat the substrate.

3. The method of claim 1, wherein the first temperature is approximately 0 to approximately 70 degrees Celsius.

4. The method of claim 1, wherein the first metallic material and the second metallic material are copper-based materials.

5. The method of claim 4, wherein the third temperature is approximately 80 degrees Celsius to approximately 400 degrees Celsius.

6. The method of claim 5, wherein the third temperature is approximately 270 degrees Celsius.

7. The method of claim 1, further comprising:
    positioning the substrate at a first position prior to depositing the first metallic material on the substrate;
    positioning the substrate at a second position, above the first position, prior to heating the substrate; and
    moving the substrate from the second position to the first position when heating of the substrate is stopped.

8. The method of claim 1, wherein heating of the substrate is from a heating source located below the substrate.

9. The method of claim 1, wherein the first period of time is approximately 30 seconds.

10. A method of filling structures on a substrate, comprising:
    depositing a first metallic material on the substrate at a first temperature;
    heating the substrate to a second temperature higher than the first temperature causing a first static reflow with a first reflow rate;
    heating the substrate to a third temperature higher than the second temperature causing a second static reflow with a second reflow rate, wherein the second reflow rate is higher than the first reflow rate;
    stopping heating of the substrate;
    applying RF bias power to the substrate; and
    depositing a second metallic material on the substrate causing a dynamic reflow of the second metallic material on the substrate.

11. The method of claim 10, wherein the first temperature is approximately 0 to approximately 70 degrees Celsius.

12. The method of claim 11, wherein the first temperature is approximately room temperature.

13. The method of claim 10, wherein the first metallic material and the second metallic material are copper-based materials.

14. The method of claim 13, wherein the second temperature is approximately 80 degrees Celsius to approximately 225 degrees Celsius.

15. The method of claim 13, wherein the third temperature is approximately 250 degrees Celsius to approximately 400 degrees Celsius.

16. The method of claim 15, wherein the third temperature is approximately 270 degrees Celsius.

17. A non-transitory, computer readable medium having instructions stored thereon that, when executed, cause a method for filling structures on a substrate to be performed, the method comprising:
    depositing a fir metallic material on the substrate at a first temperature;
    heating the substrate to a second temperature higher than the first temperature;

heating the substrate to a third temperature higher than the second temperature, heating of the substrate to the third temperature causing a static reflow of the first metallic material on the substrate;
stopping heating of the substrate; and
depositing a second metallic material on the substrate causing a dynamic reflow of the a second metallic material on the substrate.

18. The non-transitory, computer readable medium of claim 17, further comprising:
positioning the substrate at a first position prior to depositing the first metallic material on the substrate;
positioning the substrate at a second position, above the first position, prior to heating the substrate; and
moving the substrate from the second position to the first position when the heat is removed from the substrate.

19. The non-transitory, computer readable medium of claim 17, further comprising:
applying RF bias power during the dynamic reflow to heat the substrate.

* * * * *